United States Patent [19]

Boeglin

[11] Patent Number: 5,061,514

[45] Date of Patent: Oct. 29, 1991

[54] CHEMICAL VAPOR DEPOSITION (CVD) PROCESS FOR PLASMA DEPOSITING SILICON CARBIDE FILMS ONTO A SUBSTRATE

[75] Inventor: Herman J. Boeglin, Waterbury, Conn.

[73] Assignee: Olin Corporation, Cheshire, Conn.

[21] Appl. No.: 553,918

[22] Filed: Jul. 13, 1990

[51] Int. Cl.[5] ............... C23C 16/50; C23C 16/32
[52] U.S. Cl. .............................. 427/39; 427/38; 427/249
[58] Field of Search ............... 427/38, 39, 249

[56] References Cited

U.S. PATENT DOCUMENTS

| | | | |
|---|---|---|---|
| 4,459,338 | 7/1984 | Angelini et al. | 427/249 |
| 4,460,669 | 7/1984 | Ogawa et al. | 427/74 |
| 4,810,526 | 3/1989 | Ito et al. | 427/50 |
| 4,877,641 | 10/1980 | Dory | 427/38 |
| 4,877,651 | 10/1989 | Dory | 427/255 |
| 4,923,716 | 5/1990 | Brown et al. | 427/249 |

OTHER PUBLICATIONS

D. Cagliostro, et al, "Analysis of the Pyrolysis Products of Dimethyldichlorosilane in the Chemical Vapor Deposition of Silicon Carbide in Argon" J. Am. Ceram. Soc. 73 (1900).
M. L. Pearce, et al. "Formation of Silicon and Titanium Carbides by Chemical Vapor Deposition", J. Am. Ceram. Soc., 51 (1968).
Richard D. Veltri, et al., "Chemical Vapor Deposited SiC Matrix Composites", J. Am. Caram. Soc. 72 (1989).
A. Mestari, et al. "Evidence for Free Caron in Amorphous OMCVD Silicon-Rich $Si_xC_{1-x}$ Coatings", Journal de Physique, vol. 50, May 1989.
F. Langlais, et al. "On the Kinetics of the CVD of Si from $SiH_2Cl_2H_2$ and SiC from $CH_3 SiCl_3/H_2$ in a Vertical Tubular Hot-Wall Reactor" Journal de Physique, vol. 50, May, 1989, pp. 93–103.
S. Patai, et al, "The Chemistry of Organic Silicon Compounds" John Wiley & Sons (1989), pp. 1233–1234.
R. Brutsch "Chemical Vapour Deposition of Silicon Carbide and its Applications", Thin Solid Films 126 (1985), pp. 313–318.
Y. G. Roman, et al. "Silicon Carbide Chemical Vapour Infiltration", Journal de Physique, vol. 50, May 1989.

*Primary Examiner*—Shrive Beck
*Assistant Examiner*—Margaret Burke
*Attorney, Agent, or Firm*—William A. Simons

[57] ABSTRACT

A plasma CVD process for forming silicon carbide-type films onto a substrate comprising the steps of:
- (a) introducing a di-tert-butylsilane vapor into a CVD reaction zone containing said substrate on which a silcon carbide film is to be formed;
- (b) maintaining the temperature of said zone and said substrate at about 100° C. to about 400° C.;
- (c) maintaining the pressure in said zone at about 0.01 to about 10 torr; and
- (d) passing said gas into contact with said substrate while exciting said gas with a plasma for a period of time sufficient to form a silicon carbide-type film thereon, wherein said plasma is excited by DC or RF power of about 10 to about 500 watts.

12 Claims, No Drawings

CHEMICAL VAPOR DEPOSITION (CVD) PROCESS FOR PLASMA DEPOSITING SILICON CARBIDE FILMS ONTO A SUBSTRATE

CROSS-REFERENCE TO RELATED PATENT APPLICATIONS

This application is related to U.S. patent application entitled "Chemical Vapor Deposition (CVD) Process for Thermally Depositing Silicon Carbide Films Onto a Substrate" filed in the name of the same inventor simultaneously with this patent application.

BACKGROUND OF THE INVENTION

1. Field of the Invention

The present invention relates to a chemical vapor deposition (CVD) process for plasma depositing a silicon carbide film onto a substrate.

2. Brief Description of the Prior Art

Chemical vapor deposition (CVD) is used through the microelectronics industry for semiconducting and insulating thin film deposition. When films such as silicon carbide are deposited, silane ($SiH_4$) is generally used as the gaseous silicon source.

Silicon carbide (SiC) films are used in solar cells, as X-ray lithographic masks, and as hard coatings on machining tools. Silicon carbide has the necessary electrical properties for use in solar cells and has good physical properties.

Silane is highly toxic and spontaneously ignites when exposed to air. It requires the use of expensive gas cabinets and a cross-purging gas supply system. Special purging procedures are needed before introduction into deposition equipment. A number of silicon containing chemicals have been used or proposed as alternative silane sources. These include silicon tetrachloride ($SiCl_4$), silicon tetrabromide ($SiBr_4$), silicon tetrafluoride ($SiF_4$), dichlorosilane ($SiH_2Cl_2$), and disilane ($Si_2H_6$) All halogen containing silanes are toxic and corrosive themselves in addition to producing toxic and corrosive by-products. Disilane is a flammable, toxic gas that requires similar handling procedures to silane. Also, use of these alternative silicon sources requires an additional reactant such as methane to supply carbon to the deposition Process to form the silicon carbide film. Other chemicals such as tetraethylorthosilicate [TEOS, $Si(OC_2H_5)_4$] and tetramethylcyclotetrasiloxane (TMCTS, $C_4H_{16}Si_4O_2$) can only be used for oxide deposition.

Accordingly, there is a need for better alternatives to silane as a precursor for depositing silicon carbide films in CVD processes.

U.S. Pat. No. 4,459,338, which issued to Angelini, et al. on July 10, 1984, teaches a CVD process for applying silicon carbide onto a film by contacting the substrate with a gaseous mixture of methylsilane and an inert gas while heating the gaseous mixture and the substrate to about 800°–1,050° C.

U.S. Pat. No. 4,810,526, which issued to Ito, et al., on Mar. 7, 1989, teaches a CVD process for applying silicon carbide onto a substrate in a heated furnace by introducing a feedstock gas containing a single silicon and carbon source (e.g., trichloromethylsilane) into the heated furnace under a vacuum.

U.S. Pat. No. 4,923,716, which issued to Brown, et al., on May 8, 1990, teaches a CVD process for depositing silicon carbide from a vapor source having a single molecular species that has both silicon and carbon atoms in equal numbers. Preferred molecular sources include $H_3SiCH_2CH_2SiH_3$; a silacycloalkane of the form (-$SiH_2CH_2$-)p, where p is 2, 3, 4, or 5, or a cyclic structure of the form [-$SiH(CH_3)$-]$_q$, where q is 4 or 5.

Separately, di-tert-butylsilane (DTBS) is a known chemical with a Chemical Abstracts registry number [30736-07-3]. Processes for making DTBS are disclosed by Wataname, et al. "A Simple and Convenient Method for Preparing Di-t-Butyl Silanes", Chemistry Letters, pp. 1321–1322, 1981; Doyle, et al. "Hindered Organosilicon Compounds, Synthesis and Properties of Di-tert-butyl-, Di-tert-butylmethyl-, and Tri-tert-butylsilanes", J. Am. Chem. Soc. 97, pp. 3777–3782 (1975); and Triplett, et al. "Synthesis and Reactivity of Some t-Butyl-Disilanes and Digermanes", Journal of Organometallic Chemistry, Vol. 107, pp. 23–32 (1976). All three of these articles are incorporated herein by reference in their entireties. DTBS has been used as a silylation agent to hydroxy compounds (CA 101:91218v) and as an intermediate in the production of di-tert-butyldichlorosilane (CA 98:126375t).

Also, DTBS has been used as a silicon source for depositing silicon nitride or silicon dioxide by either thermal or plasma CVD processes. See U.S. Pat. Nos. 4,877,641 and 4,877,651, both of which issued to Thomas S. Dory on Oct. 31, 1989. Both of these U.S. patents are incorporated herein by reference in their entireties.

Di-tert-butylsilane (DTBS) is an air-stable, noncorrosive liquid. It is soluble in many organic solvents and does not react with water. Its high vapor pressure at room temperature allows for easy introduction into CVD reactors. No gas cabinets or cross-purging systems are needed in order to use this chemical in CVD reactors. The decomposition by-products are not corrosive in nature. Also, in the deposition of silicon carbide, DTBS can be used by itself to form the film since it contains the required carbon to form silicon carbide. Di-tert-butylsilane represents an air-stable liquid source that can be used for the deposition of silicon. This eliminates the need for using the flammable, toxic chemical, silane, and eliminates the need for an additional reactant to supply carbon for the deposition process.

BRIEF SUMMARY OF THE INVENTION

Accordingly, the present invention is directed to a plasma CVD process for forming silicon carbide-type films onto a substrate comprising the steps of:

(a) introducing di-tert-butylsilane gas into a CVD reaction zone containing said substrate on which a silicon carbide film is to be formed;

(b) maintaining the temperature of said zone and said substrate from about 100° C. to about 400° C.;

(c) maintaining the pressure in said zone from about 0.1 to about 10 torr; and (d) passing said gas into contact with said substrate while exciting said gas with a plasma for a period of time sufficient to form a silicon carbide-type film thereon, wherein said plasma is excited by DC or RF power of about 10 to about 500 watts.

DETAILED DESCRIPTION

The CVD process of this invention may be used to produce silicon carbide-type or SiC type films having an optimum refractive index in the range from about 2.6±0.4. The lower the refractive index in this range, the higher the carbon percentage; and the higher the refractive index in this range, the higher the Si percentage. The terms "silicon carbide-type films" and "SiC-type films", as used herein, mean films formed with a refractive index in the above optimum range.

Substrates may be any material on which a silicon carbide-type film is desired, e.g., silicon wafers, plastic, resin, glass, or metal objects or films; GaAs layers; or any semiconductor layer or device, preferably those employing Groups II to V of the Periodic Table of Elements or compounds thereof. The substrate is heated to the reaction temperature by a resistance element in a reaction chamber into which the vapor is introduced. In a preferred embodiment of the process, the reaction chamber is prepared for film production by the preliminary step of passivating the chamber with a silicon carbide-type coating of this invention.

While not critical, it is preferred to maintain the reaction chamber isothermal, by which is meant having temperature variations throughout of less than 2° C., preferable ±1° C. The reactant vapor is input at a sufficient distance from the wafers to be coated to permit the vapor to reach reaction temperature. Compared to the wafer mass, the vapor, at its input temperature, will not appreciably cool the wafer.

The vapor is introduced in a substantially laminar flow over the substrate surface. The residence time over the substrate is kept short to eliminate substantial concentration variations over the wafer. The substrate, typically an Si wafer, is preferably confined in a manner so as to provide a reaction chamber wall to wafer edge spacing and wafer to adjacent wafer spacing, such that the silicon carbide-type film produced by the process of this invention is substantially uniform across the wafer surface, i.e., does not exhibit substantial concavity (edge build-up) or convexity (center mounding). An example of appropriate spacing of wafer to wafer and wafer to chamber wall are discussed in Becker, et al. "Low-Pressure Deposition of High-Quality $SiO_2$ films by Pyrolysis of Tetraethylorthosilicate". J. Vac Soc. Techno. B, Vol. 6, No. 6 pp 1555-1563 (Nov./Dec., 1987). Film uniformity obtained preferably exhibits less than ±3% thickness variation, both within (across) the wafers, and from wafer to wafer in a batch or production run.

Typical gas flow rates may be on the order of from 10 to about 400 standard cc/min. for the DTBS. The preferred gas flow rate range is about 20 to about 200 sccm.

As mentioned above, the reaction chamber pressures are controlled in the range of from about 0.1 torr to about 10 torr. The preferred range being from about 0.5 torr to 5 torr, and the most preferred range is about 0.75 torr to about 2.0 torr. As also mentioned above, the reaction temperature is from about 100° C. to 400° C. The preferred temperature range is about 125° C. to about 325° C., more preferably from about 200° C. to about 300° C.

The plasma can be either a direct current or DC plasma or struck by means of a radio frequency (RF) generator and electrode in the CVD reactor zone. There are two widely used RF generators in the plasma CVD area today. One is capable of generating a plasma at 13.56 MHz at a power of about 10 to about 200 watts, preferably from about 12 to 75 watts. The second widely used plasma-generating frequency is 50 KHz at a power of about 100 to about 500 watts, preferably about 150 to about 400 watts. However, the broadest aspects of the present invention is not to be limited to just these two frequencies.

The film formation rate is typically in the range of from about 10 to about 500 Angstroms/minute with typical operating rates of from about 30-300 Å/min., with the optimum being 50-200 Å/min. at an optimum pressure of about 0.075-2.0 torr at an optimum temperature range from about 200° C. to 300° C.

The following example further illustrates the present invention. All parts and percentages are by weight unless explicitly stated otherwise.

EXAMPLE 1

Plasma Deposition of Silicon Carbide (SiC) Employing DTBS as a Reactant

For this example, a gradient field plasma deposition system manufactured by Solar Physics Corporation of Locust Valley, Long Island, N.Y. was used. Vapor control to the system was accomplished by use of a Model LC2-41VS01 mass flow controller manufactured by Vacuum General of San Diego, Calif. Liquid di-tert-butylsilane was contained in a 1.2 liter capacity stainless steel ampule, and the temperature of the ampule was maintained at 40° C. by using a source controller (Model 875) manufactured by Olin Hunt Corporation of Seward, Ill. Vapor from the DTBS was fed to the vapor mass flow controller.

About 5 glass slides 2 inches wide by 4 inches long were mounted on the cathode of the plasma deposition system. The temperature of the glass substrates was taken to 300° C. and the system was pumped down to the base pressure of 0.050 torr. DTBS was introduced into the reactor at approximately 20 sccm through the mass flow controller. The introduction of the DTBS causes the pressure to rise to about 0.5 to 1.0 torr. A direct current plasma was struck, and the power was set to 15 watts. Reaction and decomposition of the DTBS vapor formed silicon carbide on the surfaces of the glass slides. After 15 minutes, the power was shut off, the DTBS flow was stopped, and nitrogen gas introduced to purge the system. After flushing the system for a sufficient time, the system was vented and the glass slides removed.

The silicon carbide films on the glass slides were examined. A sputtered AUGER profile was done on a sample of the film. The results of the profile indicated that the average silicon carbide thickness was 2,000 Å. The average atomic concentration of silicon in the film was measured at 22%. The average atomic concentration of carbon in the film was measured at 68%, with the remainder being oxygen.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A plasma CVD process for forming silicon carbide-type films onto a substrate comprising the steps of:
   (a) introducing di-tert-butylsilane vapor into a CVD reaction zone containing said substrate on which a silicon carbide film is to be formed;
   (b) maintaining the temperature of said zone and said substrate at about 100° C. to about 400° C.;
   (c) maintaining the pressure in said zone at about 0.1 to about 10 torr; and (d) passing said gas into contact with said substrate while exciting said gas with a plasma for a period of time sufficient to form a silicon carbide-type film thereon, wherein said Plasma is excited by DC or RF Power of about 10 to about 500 watts.

2. The plasma CVD process of claim 1, wherein the flow rate of said di-tert-butylsilane into said zone is from about 10 sccm to about 400 sccm.

3. The plasma CVD process of claim 1, wherein said zone temperature and said substrate temperature are from about 125° C. to about 325° C.

4. The plasma CVD process of claim 1, wherein said zone pressure is from about 0.5 torr to about 5 torr.

5. The plasma CVD process of claim 1, wherein said di-tert-butylsilane film rate is formed at a rate from about 10 to about 500 Angstroms/minute.

6. The plasma CVD process of claim 1, wherein said substrate is selected from the group consisting of resin objects or films, glass objects or films, metal objects or films, GaAs layers, and semiconductor layers or devices.

7. A plasma CVD process for forming silicon carbide-type film onto a substrate comprising the steps of:
(a) introducing di-tert-butylsilane vapor into a CVD reaction zone containing said substrate on which a silicon carbide film is to be formed; the flow rate of said di-tert-butylsilane into said zone is from about 10 sccm to about 400 sccm;
(b) maintaining the temperature of said zone and said substrate at about 125° C. to about 325° C.;
(c) maintaining the pressure of said zone at about 0.5 torr to about 5 torr; and
(d) passing said gas into contact with said substrate while exciting said gas with a plasma for a period of time sufficient to form a silicon carbide-type film thereon, wherein said plasma is excited by DC or RF power of about 10 to about 500 watts, the rate of film formation being at about 10 to about 500 Angstroms per minute.

8. The plasma CVD process of claim 7, wherein said flow rate of di-tert-butylsilane is from about 20 to about 200 sccm.

9. The plasma CVD process of claim 7, wherein said temperature is from about 200° C. to about 300° C.

10. The plasma CVD process of claim 7, wherein said Pressure is from about 0.75 to about 2.0 torr.

11. The plasma CVD process of claim 7, wherein said film formation rate is from about 30 to about 300 Angstroms per minute.

12. The plasma CVD process of claim 7, wherein said substrate is selected from the group consisting of resin objects or films, glass objects of films, metal objects or films, GaAs layers, and semiconductor layers or devices.

* * * * *